(12) United States Patent
Bhatt et al.

(10) Patent No.: US 6,436,803 B2
(45) Date of Patent: Aug. 20, 2002

(54) MANUFACTURING COMPUTER SYSTEMS WITH FINE LINE CIRCUITIZED SUBSTRATES

(75) Inventors: Anilkumar Chinuprasad Bhatt, Johnson City; Roy Harvey Magnuson, Endicott; Thomas Richard Miller; Voya Rista Markovich, both of Endwell; Carlos J. Sambucetti, Croton-on-Hudson; Stephen Leo Tisdale, Endwell, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/840,432

(22) Filed: Apr. 23, 2001

Related U.S. Application Data (62) Division of application No. 08/672,290, filed on Jun. 28, 1996, now Pat. No. 6,268,016.

(51) Int. Cl.[7] .............................................. H01L 21/44
(52) U.S. Cl. ...................... 438/612; 438/614; 438/622; 427/97; 427/98; 29/830; 29/852
(58) Field of Search ................................. 438/612, 614, 438/622; 29/852, 830; 156/89.13; 174/266, 270; 427/98, 97

(56) References Cited

U.S. PATENT DOCUMENTS

| | | | |
|---|---|---|---|
| 4,217,182 A | * | 8/1980 | Cross .......................... 174/250 |
| 4,378,384 A | | 3/1983 | Murakami et al. |
| 4,448,804 A | | 5/1984 | Amelio et al. |
| 4,495,216 A | | 1/1985 | Soerensen et al. |
| 4,528,245 A | | 7/1985 | Jobbins |
| 4,601,847 A | | 7/1986 | Barber, Jr. |
| 4,631,117 A | | 12/1986 | Minten et al. |
| 4,639,380 A | | 1/1987 | Amelio et al. |
| 4,684,550 A | | 8/1987 | Milius et al. |
| 4,716,059 A | | 12/1987 | Kim |

(List continued on next page.)

FOREIGN PATENT DOCUMENTS

JP          022477      *  1/1990

*Primary Examiner*—Kevin M. Picardat
(74) *Attorney, Agent, or Firm*—Schmeiser, Olsen & Watts; Lawrence R. Fraley (57) ABSTRACT

Circuit boards are manufactured by forming a substrate with a dielectric surface and laminating a metal foil onto the substrate. The metal foil is patterned to form a first wiring layer. A permanent photoimagable dielectric layer is formed over the wiring layer and via holes are formed through the dielectric layer over pads and conductors of the wiring layer. Holes are formed through the substrate and substrate surfaces including the photoimagable dielectric, walls of the via holes, and walls of the through holes subjected to an electroless copper plating process. The process includes seeding the surface, coating the surface with a first solution containing surfactant and electroplating in a second solution in which the level of surfactant is regulated by determining the surface tension and metering surfactant addition to the second solution depending on the determination of surface tension. The copper plating on the photoimagable dielectric is patterned to form an exterior wiring layer which is covered by solder resist with windows over lands around the through holes and surface mount connection pads of the exterior wiring layer to form a high density circuitized substrate. Surface mount components and/or pin in hole components are attached to the circuitized substrate with solder joints between terminals of the components and the lands and/or connection pads to form a high density circuit board assembly. One or more of the circuit board assemblies are mounted in an enclosure with a power supply, CPU, RAM, and I/O means to form an information handling system with increased performance due to shorter signal flight times due to the higher device density.

33 Claims, 7 Drawing Sheets

U.S. PATENT DOCUMENTS

| | | | |
|---|---|---|---|
| 4,820,388 A | | 4/1989 | Kurze et al. |
| 4,897,338 A | * | 1/1990 | Spicciati et al. |
| 4,908,087 A | * | 3/1990 | Murooka et al. |
| 5,026,624 A | * | 6/1991 | Day et al. |
| 5,166,037 A | * | 11/1992 | Atkinson et al. |
| 5,200,026 A | * | 4/1993 | Okabe |
| 5,250,105 A | * | 10/1993 | Gomes et al. |
| 5,266,103 A | * | 11/1993 | Uchida et al. |
| 5,266,446 A | * | 11/1993 | Chang et al. |
| 5,300,402 A | * | 4/1994 | Card, Jr. et al. |
| 5,348,574 A | * | 9/1994 | Tokas et al. |
| 5,439,779 A | * | 8/1995 | Day et al. |
| 5,557,844 A | | 9/1996 | Bhatt et al. |

* cited by examiner

MANUFACTURING COMPUTER SYSTEMS WITH FINE LINE CIRCUITIZED SUBSTRATES

This application is a divisional of Serial No. 08/672,290, filed on Jun. 28, 1996 now U.S. Pat. No. 6,268,016.

This document is protected by copyright except to the extent required by law to obtain and continue all available patent protection.

FIELD OF THE INVENTION

These inventions relate to the manufacture of high density computer systems using circuit board assemblies having very small pads (4–12 mil) for connection of flip chips and wire bond chips and/or very fine conductors for fan out from ball grid array modules, fine pitch (0.3–0.6 mm spacing) leaded components, flip chips, or wire bond chips that are attached to the circuit board assemblies. These inventions also relate to the manufacture of chip carriers in which flip chips and/or wire bond chips are connected to such very small pads and in which very fine conductors fan out from the chip connection pads to terminals for connection to circuit board assemblies. More specifically these inventions relate to an additive processes in which metal is fully electrolessly deposited onto substrates to form these very fine conductors and very small pads.

BACKGROUND

The following background is for convenience of those skilled in the art and for incorporating the listed citations by reference. The following background information is not an assertion that a search has been made, or that the following citations are analogous art, or that any of the following citations are pertinent or the only pertinent art that exists, or that any of the following citations are prior art.

The continued introduction of higher I/O and higher density surface mount components especially 0.3–0.6 mm gull wing leaded components, 40 mil ball grid array BGA modules, as well as the direct connection flip chips and wire bond chips to circuit boards, has resulted in a need for very fine conductors on organic circuit boards for fan out at these components. Also, the introduction of connecting flip chips and wire bond chips directly onto organic and metal circuit boards requires very small pads to be reliably formed. Furthermore, the introduction of chip carrier modules with organic and organic coated metal substrates has created a demand for very fine conductors and very small pads on organic surfaces.

Commonly, circuit boards include buried power planes (ground and other voltage levels) and signal planes on the surface. Such wiring layers are separated by layers of fiberglass filled epoxy (FR4 and G10). Connections between wiring layers are formed by drilling holes and plating the holes with copper to form plated through holes (PTHs). The power planes are pre-patterned with openings so that not all PTHs are required to connect to all the power planes. The PTHs and their surrounding lands require substantial surface area which can not be easily reduced because plating requires circulation of fluids in the holes.

More exotic circuit boards include multiple exterior signal wiring layers which may be separated by thin dielectric layers known as thin film. In order to provide higher density of conductors and pads, holes are formed through the thin dielectric layers by photolithography (producing photo vias) and plated to electrically connect between adjacent exterior wiring layers.

In subtractive processing, copper is plated over the entire surface of the substrate and onto the walls of through holes. Usually the copper is provided by electrolessly plating a thin strike layer, then electroplating a thick coating over the strike layer. Then the surface is coated with a photoresist that tents over the through holes, the photoresist is exposed and developed to provide a pattern that covers only the desired copper, and then the exposed copper is etched away to form an exterior wiring layer.

Another commonly used process is partial additive or semi-additive plating. In this process a very thin flash layer of copper is electrolessly deposited over the entire surface and in the through holes. Then the surface is coated with a photoresist which is exposed and developed to provide a pattern that covers the flash layer except the desired wiring pattern. Then copper is electroplated onto the exposed portion of the strike layer, a protective metal may be electroplated over the copper, the photoresist is stripped away, and the exposed flash layer is etched away.

In electroless plating the surface of a substrate is seeded by a catalyst material and then submerged in an electroless plating bath in which copper is chemically plated over the catalyst without providing any external electrical potentials. Deposition by electroless plating requires far more time than electroplating; thus, electroless plating is commonly used only for a thin layer called a flash or strike layer to allow subsequent electroplating.

For providing very fine conductors, full additive electroless copper plating is preferred in order to provide finer conductors and eliminate the risk of tenting failure causing etching away of copper plated in very small photo vias. In one method the surface is seeded, then a photoresist pattern is formed over the surface, a wiring layer is electrolessly formed at openings in the photoresist pattern, the photoresist is stripped and the remaining catalyst is removed. Alternately, the photoresist is deposited and patterned, the seeding layer is deposited over the exposed surface of the substrate and photoresist and then the photoresist is stripped to remove the undesired copper.

Those skilled in the art are directed to the following references. U.S. Pat. No. 4,908,087 to Murooka describes laminating to form a substrate structure. U.S. Pat. No. 3,163,588 to Shortt suggests stripable frisket, seeding and electroplating. U.S. Pat. No. 5,166,037 to Atkinson describes forming wiring layers on circuit board substrates with electroless plating. *Printed Circuit Base* by Marshall in *IBM TDB* Vol. 10, No. 5, October 1967, describes a sensitizing material. U.S. Pat. No. 4,590,539 to Sanjana discloses epoxies, fillers, curing agents, and catalysts. U.S. Pat. No. 4,217,182 to Cross, U.S. Pat. No. 4,378,384 to Murakami, U.S. Pat. No. 4,495,216 to Soerensen, U.S. Pat. No. 4,528,245 to Jobbins, U.S. Pat. No. 4,631,117 to Minten, U.S. Pat. No. 4,639,380 to Amelio, U.S. Pat. No. 4,684,550 to Milius, U.S. Pat. No. 4,601,847 to Barber, U.S. Pat. No. 4,820,388 to Kurze, U.S. Pat. No. 4,716,059 to Kim, and U.S. Pat. No. 5,250,105 to Gomes suggests treatment with surfactant before electroless plating. Also, Japanese patent JP 02-22477 to Takita suggests treating with surfactant prior to electroless plating. In the prior art surfactant treatment was followed by applications of catalyst, acid, or rinsing prior to electroless plating. U.S. Pat. No. 4,448,804 to Amelio, U.S. Pat. No. 4,964,948 to Reed, and U.S. Pat. No. 5,348,574 to Tokas suggests methods and materials for seeding a substrate prior to electroless plating. U.S. Pat. No. 5,200,026 to Okabe and U.S. Pat. No. 5,266,446 to Chang suggest processes for forming thin film structures on substrates. U.S. Pat. No. 4,897,338 to Spicciati, U.S. Pat. No. 4,940,651 to Brown, U.S. Pat. No. 5,070,002 to Leech, U.S. Pat. No. 5,300,402 to Card, U.S. Pat. No. 5,427,895 to Magnuson, and U.S. Pat. No. 5,026,624 and U.S. Pat. No. 5,439,779 to Day discuss photoresists.

The proceeding citations are hereby incorporated in whole by reference.

SUMMARY OF THE INVENTION

In the inventions of Applicants, a layer of fluid containing surfactant is applied over a catalyst layer on a substrate and the wet substrate is treated in an electroless bath. The level of surfactant in the bath is approximately ascertained by determining the surface tension of the electroless solution and surfactant is metered into the bath depending on the determination of surface tension.

The invention reduces the number of voids in a full electroless additive circuitization of small features which allows very fine line widths and very small pad sizes to be reliably formed. The invention allows flip chip and wire bond pads to be reliably formed on organic surfaced component substrates and also on organic surfaced circuit board substrates to greatly increase device density on the circuit board. The invention includes circuit boards made by the process of the invention in which surface mount components may be placed at a higher density to allow reduced signal flight times and faster circuit board speeds. Furthermore, the invention includes a computer system which operates faster due to the shorter signal flight times which result from the higher wiring densities of the invention.

Other features and advantages of this invention will become apparent from the following detailed description of the presently preferred embodiments of the invention illustrated by these drawings.

DETAILED DESCRIPTION

Figures 1A, 1B, 1C:
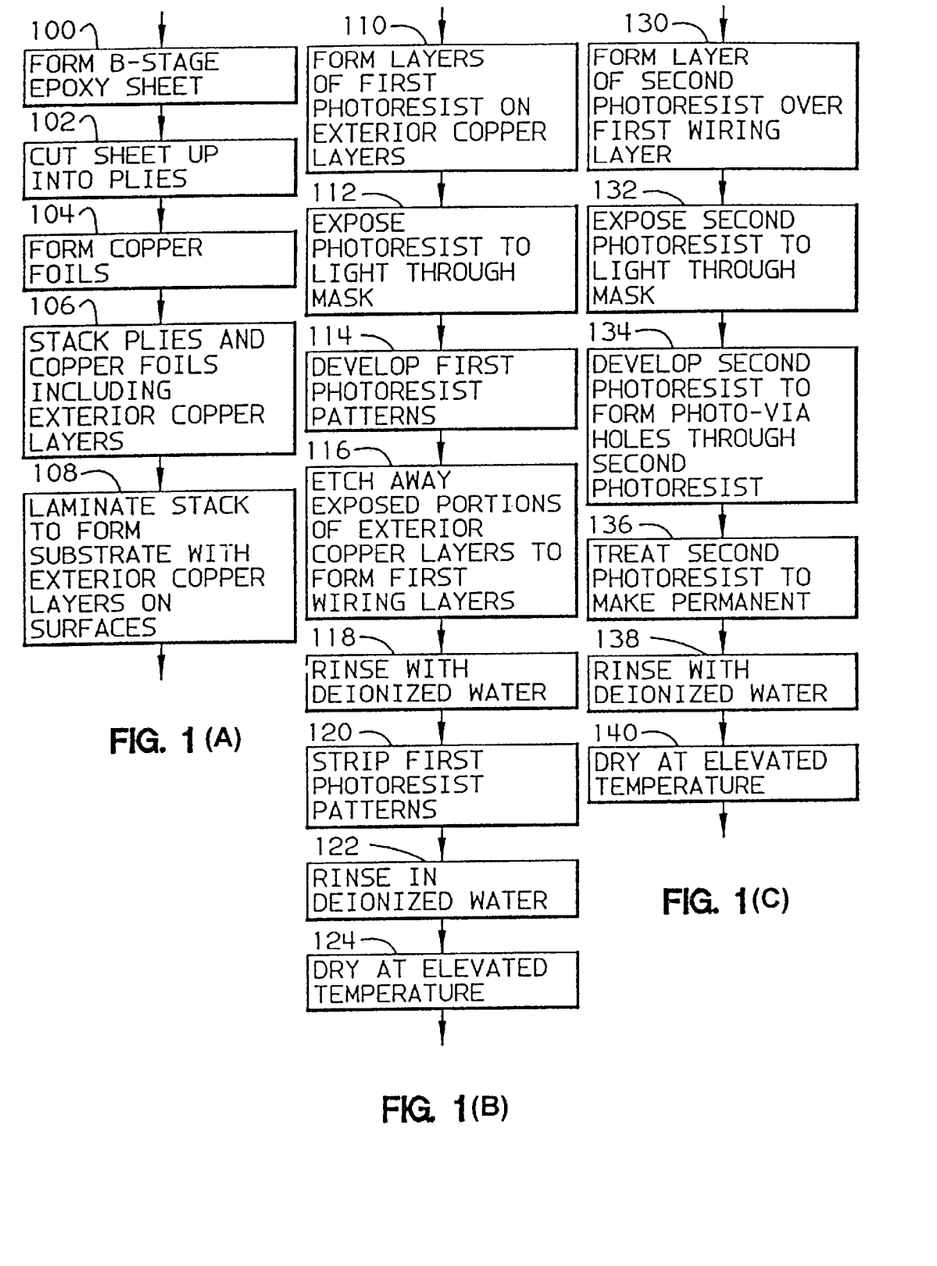
FIGS. 1(a)–1(g) is a flow diagram illustrating a specific embodiment of the process of the invention.

In steps 100–108 of FIG. 1(a), a substrate structure is formed. The substrate may include ceramic plies (e.g. alumina, or berillia); or a metal plies (e.g. Cu, Al, Invar, Kovar, or Cu-Invar-Cu) covered with dielectric material (e.g. polyimide, or epoxy); or organic plies (e.g. epoxy) preferably filled with axially stiff fibers (fiberglass or polyaride fibers); or flexible plies of dielectric films (polyimide).

As shown in FIG. 1(a) in step 100, a B-stage epoxy sheet is made such as directing continuous woven fiberglass through a bath of epoxy precursor to form a sheet, and heating the sheet to partially cure the sheet to form a B-stage. Then in step 102, the sheet is cut into plies. Copper foils are formed for wiring layers openings are punched in the foils for internal power planes which do not connect to vias which will be drilled through the openings. In step 106, a stack of B-stage plies separated and covered with metal foils is formed and in step 108, the stack is laminated with heat and pressure.

Figure 3:
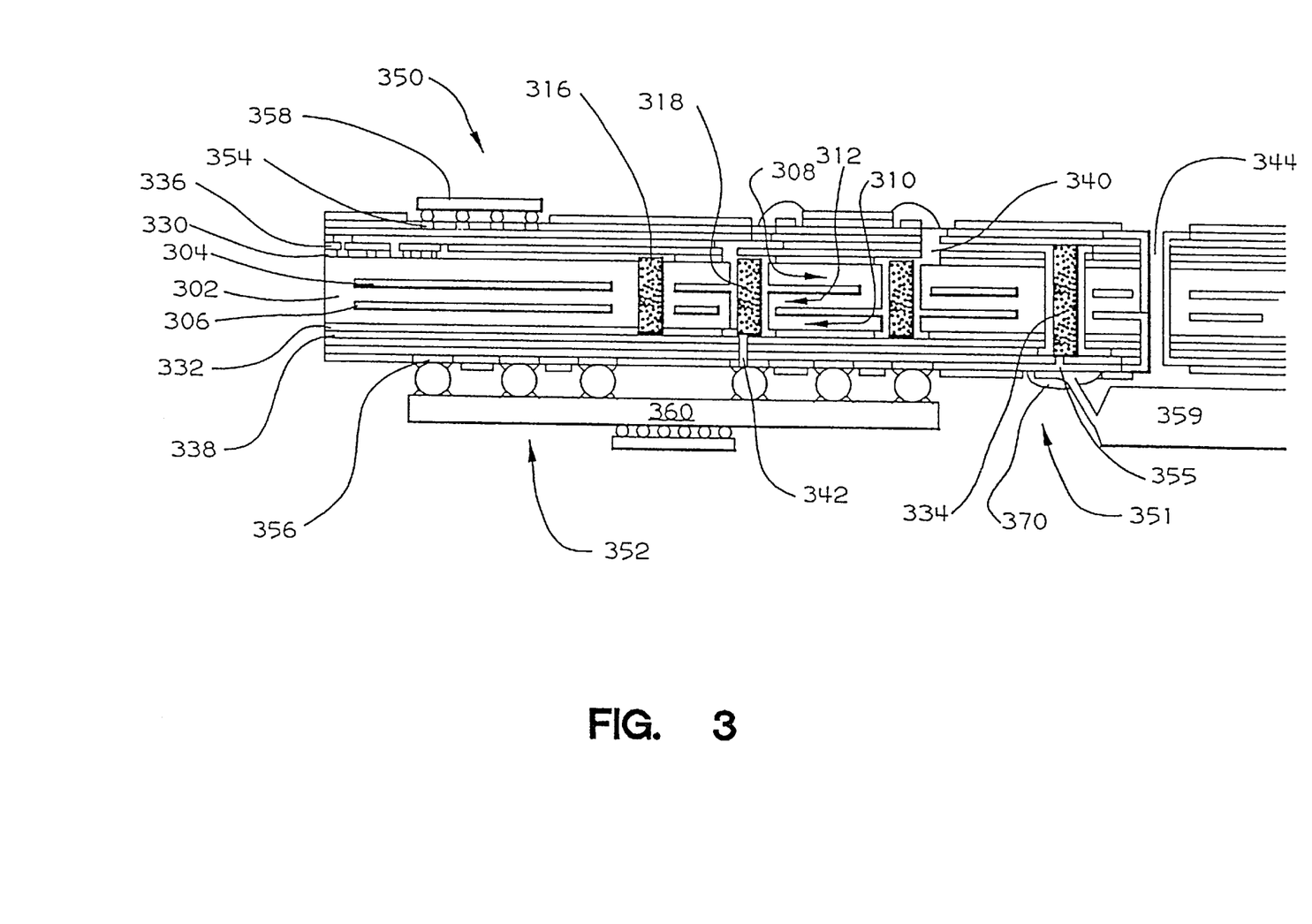
FIG. 3 schematically shows a portion of a circuit board assembly of the invention.

For example, in FIG. 3, circuit board substrate 302 includes two buried metal wiring layers 304,306 (power and ground planes) and three dielectric layers 308,310,312. The dielectric layers may be ceramic or organic material or metal covered with dielectric. The substrate may have buried vias such as hole 316 which is an unplated hole filled with an electroconductive material such as epoxy filled with copper particles; or hole 318 which a plated through holes (PTH) filled with thermoconductive material such as epoxy filled with glass particles. Metal such as copper will be plated over the filled holes.

The metalized surface of the substrate structure may be vapor blasted and/or treated in a chloriting bath and/or micro-etched and/or treated with pumice to increase adhesion to a photoresist.

In step 110 of FIG. 1(b), a layer of first photoresist is formed over the continuous layer of metal. Preferably a dry film photoresist about 0.1 to about 4.0 mils thick is used. Alternately a liquid photoresist may be applied for example by spinning. In step 112, the photoresist is exposed to a pattern of electromagnetic radiation or a particle beam. The radiation may be produced in a pattern using a laser or a source of visible light, UV light, or X-ray may be directed through a mask to form a pattern. The type of radiation or particle beam depends on the availability of equipment and the chemistry of the photoresist. In step 114, the photoresist is developed to form a first pattern of photoresist. Development usually includes rinsing with a solvent such as deionized water. The solvent is selected depending on the chemistry of the photoresist. The pattern covers portions of the metal layer which will form a wiring layer on the surface of the substrate. Other portions of the continuous metal layer are exposed and in step 116, the exposed portions of the metal are etched away to form a first wiring layer (signal layer). For copper the preferred etchant is cupric chloride, but other etchants may be used. The first wiring layer 330 and 332 is shown in FIG. 3. In step 118 of FIG. 1(b), the etchant is rinsed away, and in step 120, the first photoresist is stripped away.

The photoresist may be a positive resist in which case the photoresist is exposed and the exposed portions become softened and are rinsed away to form the photoresist pattern and after etching the remaining photoresist is blanket exposed and rinsed away to strip the photoresist off the patterned wiring layer. In patterning negative photoresists, the exposed portions become hardened and the unexposed portions are rinsed away then after etching the pattern of the negative photoresist is removed using a solvent or enchant.

In step 122, the substrate structure is rinsed with deionized water and in step 124, the substrate is dried at an elevated temperature. The drying may include blowing heated air on the substrate in a convection oven.

The following steps 130–192 may be performed sequentially once or multiple times as desired, to provide one or more wiring layers on each of the surfaces of the substrate.

In step 130 in FIG. 1(c), a layer of photoimagable dielectric is formed over the exterior wiring layer. Again, a dry film photoresist is preferred. The photoimagable dielectric can be the same material or a different material than the first photoresist and either a positive or negative photoresist.

In step 132, the photoimagable dielectric is exposed as described above, and in step 134, is developed as described above to form a pattern of photoimagable dielectric. Preferably as shown in FIG. 3, the pattern of photoresist layers 336,338 consist only of via holes such as at 340,342 that extend through the photoresist over pads or conductors of the first wiring layer. In step 136, the photoimagable dielectric is treated to make it permanent for example by baking a positive photoresist so that it is not effected by subsequent exposure to light and subsequent plating, etching, developing steps do not affect the photoimagable dielectric. This step may not be required for some negative photoresists. In step 138, the structure is rinsed in deionized water and in step 140, is dried at elevated temperature as discussed above.

Figures 1D, 1E, 1F:
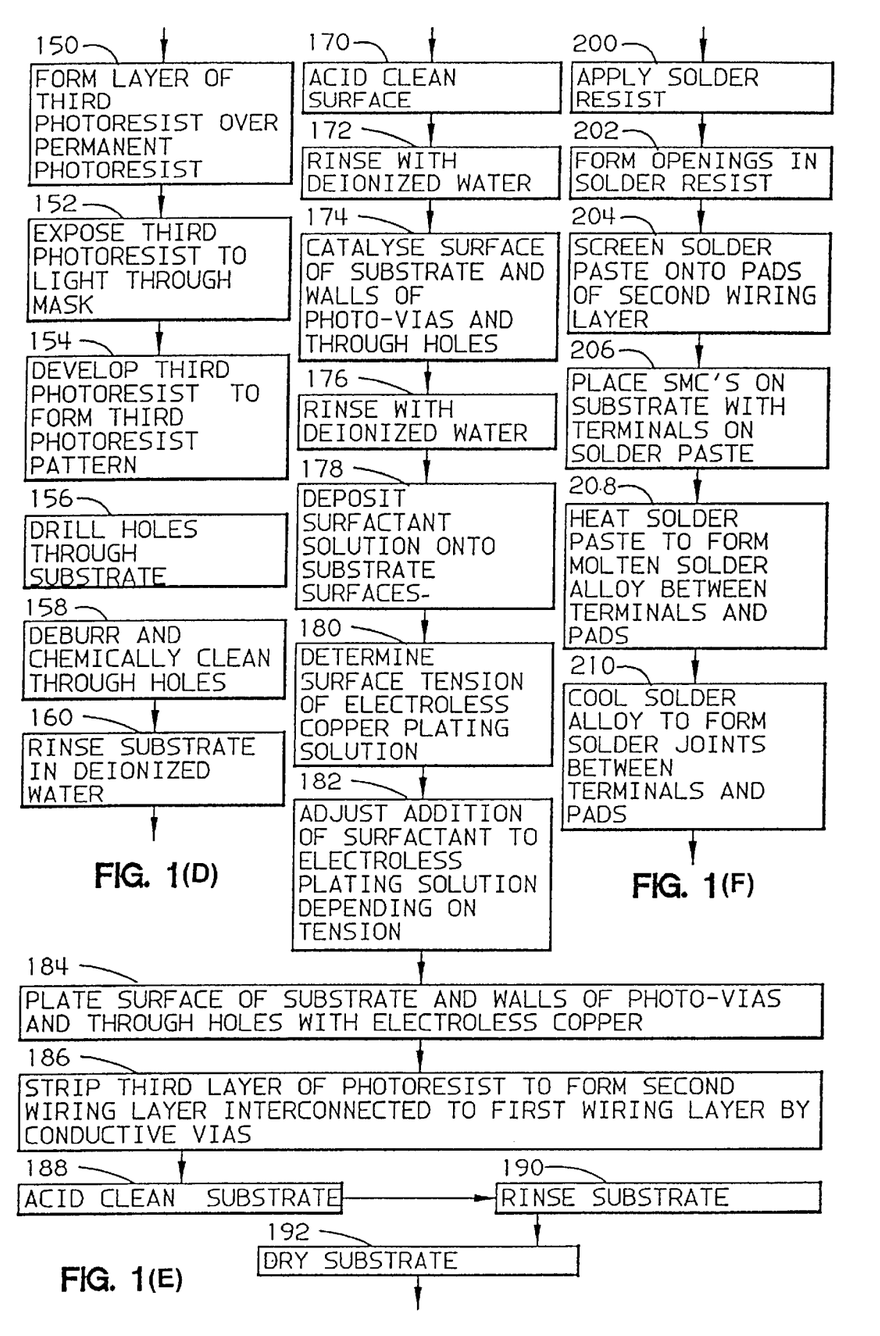

In step 150 in FIG. 1(d), a third layer of photoresist is formed over the permanent photoimagable dielectric, and in step 152, the third photoresist is exposed as described above. In step 154, the third photoresist is developed to form a pattern of third photoresist.

The following steps 156 and 158 may be performed for any layer for electrical connection between layers. For buried layers preferably the holes are filled with electroconductive organic material or are plated and filled with organic material which may be thermoconductive as described above. The steps 156,158 are also performed when forming the last wiring layer on the surfaces of the substrate when PIH components are to be connected. For example in FIG. 3, three external wiring layers are provided and PTH 344 is provided when forming the final wiring layer for interconnection and/or PIH component connection.

In step 156 of FIG. 1(d), holes are formed through the substrate to provide PTHs for PIH components and/or wiring layer interconnection. The holes may be formed by laser drilling, punching, or by mechanical drilling using a drill bit. In step 158, the holes are treated to remove debris and improve electrical connection. For holes mechanically formed using a drill bit, the holes should be deburred and chemically cleaned in step 158, to remove smear from internal wiring layers for electrical connection thereto. In step 160, the substrate is rinsed in deionized water.

In steps 170–192 of FIG. 1(e), the surface of the substrate including the photoimagable dielectric as well as the walls of the photo-vias and any holes for PIH components, are subjected to an electroless plating process. In step 170, the surfaces are cleaned and micro-etched in an acid bath and in step 172, the surfaces are rinsed in deionized water. In step 174, the surfaces are seeded for electroless metal plating and in step 176, the seeded layer is rinsed with deionized water. In step 178, a solution of surfactant is deposited on the surfaces and then the surfaces are immediately exposed to an electroless plating solution. Applicants have discovered that coating the surfaces of the substrate with surfactant solution immediately prior to electroless plating greatly reduces the number of voids in very fine circuit lines and very small pads formed by full additive electroless plating. A residual amount of surfactant on the substrate appears to be more effective than just providing surfactant in the plating bath. However, the surface tension in the plating bath also contributes to reducing the voids as discussed below. In step 180, the surface tension of the electroless plating solution is determined and in step 182, the metering of surfactant into the plating bath is regulated depending on the determination of surface tension. Applicants have discovered that regulating the surface tension is critical for reliably forming void free very fine lines and very small pads during full additive electroless plating. The surface tension is controlled by adjusting the level of surfactant in the plating solution. The expense of determining the level of surfactant may be greatly reduced by measuring the surface tension (rather than the level of surfactant). Since the voids seem to be related to air bubbles trapped on the surface and in the holes and vias, the level of surface tension is the critical variable that need to be kept constant.

In step 184, a full thickness of metal is formed on the seeded surfaces by electroless plating. Preferably the coating is copper with a thickness of 0.2 to 4 oz of Cu per square foot, more preferably about 1 oz (0.5–2 oz) per square foot. Preferably the copper is at least 1 mil thick in any plated through holes. Finally in step 186, the layer of third photoresist is stripped to remove plated metal covering the third photoresist and form a second wiring layer. Alternatively, the surface of the substrate may be flattened using chemical-mechanical polishing to remove any metal plating the third photoresist to form the second wiring layer, and the third photoresist layer may be treated as described above to make it permanent.

In step 188, the substrate is exposed to acid to clean the substrate and micro-etch the surface for adhesion to the next layer of photoresist or solder resist.

In FIG. 3, three external wiring layers are shown. This structure is produced by performing steps 130–192 twice in succession.

In steps 200–212 of FIG. 1(f), surface mount technology (SMT) components (leaded and BGA), flip chips, and/or wire bond chips are connected to the substrate to form a circuit board assembly or a chip carrier module. In step 200, a solder resist is applied to the surfaces of the circuit board to prevent solder from wicking down conductors away from SMT connection pads and any lands for PIH connection. The solder resist may be a photoimagable dielectric or a common solder resist. The solder resist may be applied by roll coating, curtain coating, print screening, or lamination of a dry layer onto the surface. Then in step 202, windows may be formed photolithographically in the solder resist over pads for surface mount components and lands for PIH components. For screened solder resist larger windows may be formed during screening onto the wiring layer and smaller windows formed by photo processing if required. In FIG. 3, windows 350,351,352 expose pads 354,355,356 respectively for flip chip 358, leaded component 359, and BGA component 360 respectively. Pads 354 are spaced 5 to 15 mils apart for connection of the flip chip or wire bond chip, pads 355 are spaced at 10 to 30 mils for leaded components, and pads 356 are spaced at 30 to 50 mils for connection of a BGA module.

The circuitized substrate of the invention has improved wirability due to reduced via diameters and reduced land diameters of the first and second wiring layer. In step 204 of FIG. 1(f), joining material 370 (FIG. 3) is screened into the windows onto the pads for surface mount connection. Alternately the joining material may be screened onto the component terminals or the pads or terminals may otherwise be coated with joining material. The joining material may be an ECA with conductive particles or a TLP system or a solder paste or a solder alloy may be provided on the pads or terminals and a flux applied to the pads and/or terminals for soldered connections. Solder paste consists of liquid flux and metal particles which melt during reflow heating to form molten solder alloy such as approximately eutectic Pb/Sn solder (e.g. Pb and 30–80% Sn preferably 55–70% Sn). In step 206, the terminals (balls, leads, pads) of surface mount components are positioned at the pads (close enough for reflowed connection between the pads and the terminals). In step 208, the solder material is cured. For solder paste the curing includes heating the paste above the melting temperature of the solder alloy. In step 210, the joining material is cooled to form solid joints between the terminals and pads.

Figure 1G:
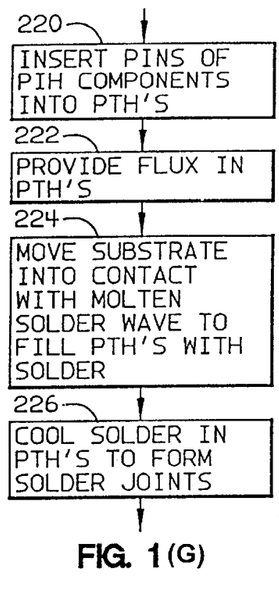

When PIH components are required then steps 220–228 of FIG. 1(j) are also performed. In step 220, PIH components are placed on the substrate with pins or leads of the component in PTHs. In step 222, flux is applied into the holes to provide a more solder wettable metal surface. In step 124, the substrate is moved over a wave or fountain of solder in contact with the molten solder which wets to lands on the bottom of the board and fills the PTHs by capillary action (surface tension). Then in step 226, the solder is cooled to form solid joints of solder alloy.

Alternatively, solder paste may be applied to the top surface of the substrate over the lands around the PTHs and the pins of the components inserted through the paste deposits. Then during reflow for the surface mount components the solder paste reflows to form solder alloy which fills up the respective PTH.

Steps 250–284 in FIGS. 2(a)–29(b), illustrate an alternative embodiment for the steps 170–192 of FIG. 1(e) of the process of the invention for forming additional wiring layers such as a second wiring layer on each side of the substrate. FIG. 1(e) illustrates an additive process and FIGS. 2(a)–2(b) illustrate a subtractive embodiment.

Figure 2A:
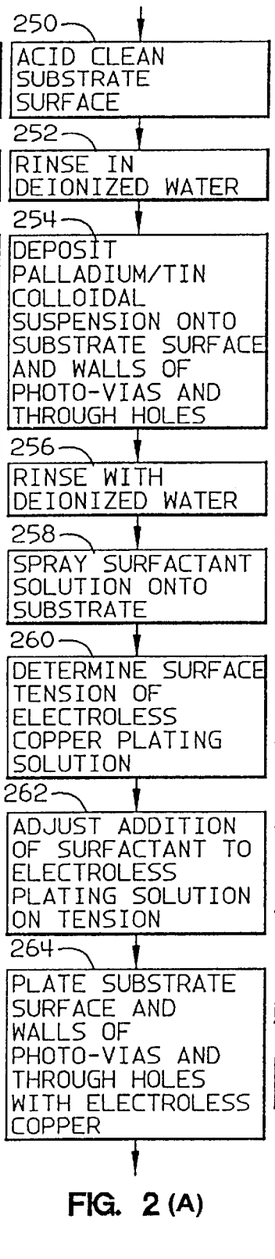
FIGS. 2(a)–2(b) is another flow diagram illustrating an alternative specific embodiment of the invention.
Figure 2B:
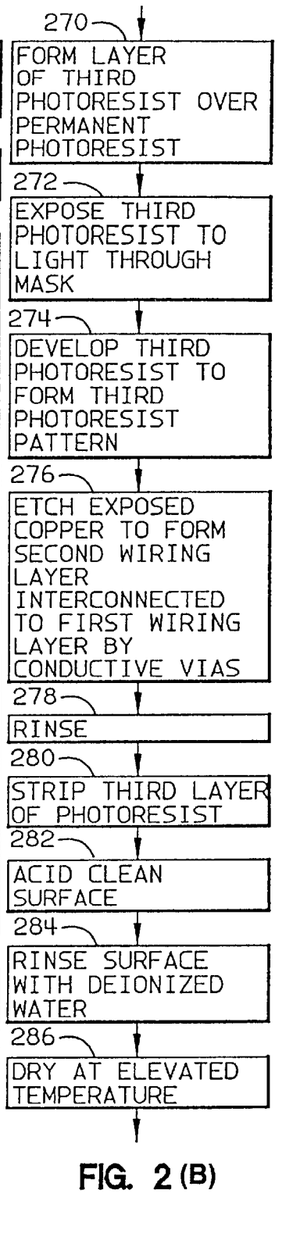

Steps 250–264 in FIG. 2(a) are similar to steps 156–184 and the above discussion thereof applies. Also, steps 270–286 are similar to steps 110–124 in FIG. 1(b) and the above discussion thereof applies.

FIG. 4(a)–FIG. 4(d), illustrate a manufacturing line for another embodiment of the invention. Some process steps such as optional hole drilling for plated through holes discussed above, have intentionally been left out of the following process described for illustrative purposes. Substrate 400 is provided from roll 402 and first photoimagable dielectric 404,406 from roles 408,410 is laminated with heat and pressure to substrate 400 in oven 412 by heated rollers 414,416 to form structure 418. The substrate in this embodiment is a patterned copper film or an organic substrate with surface wiring layers. Those skilled in the art will know how to modify this embodiment for substrates with dielectric surfaces.

Figure 4:
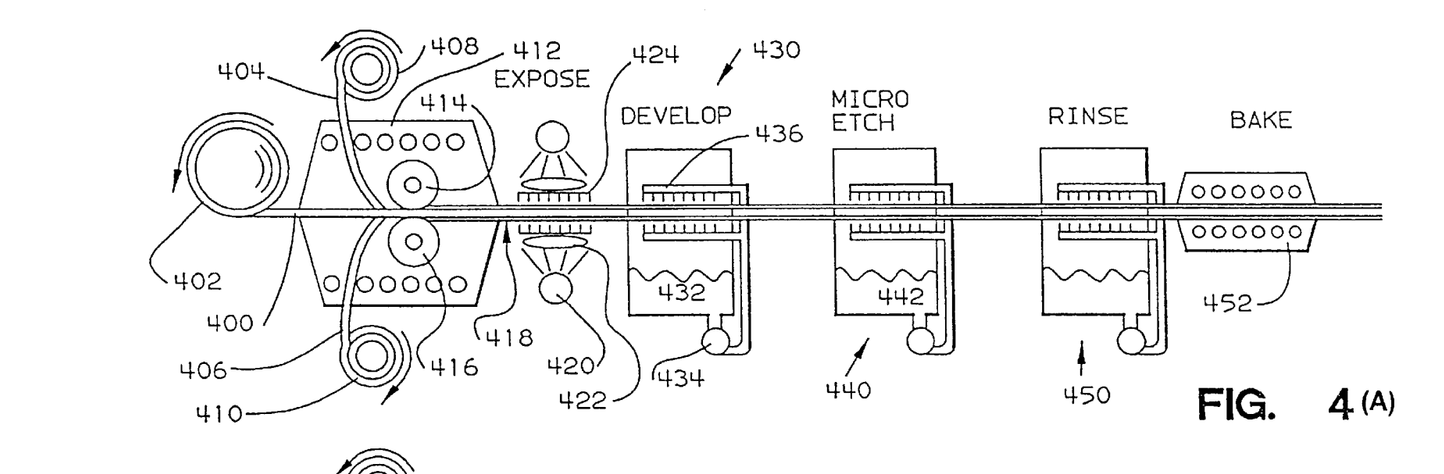
FIGS. 4(a)–4(d) schematically show a portion of the manufacturing line for making another embodiment of the invention.

A source of light 420 is culminated by lens 422 and patterned by mask 424 to expose a part of the photoimagable dielectric 404,406. At station 430, development fluid 432 is delivered by pump 434 to nozzle 436 and sprayed onto the substrate structure 418 to remove the exposed portion of the photoimagable dielectric which is preferably via holes. At station 440 the structure is micro etched by acid 442, and the structure is rinsed in station 450. The structure is baked in convection oven 452 until dry. The substrate may be rolled and stored at this stage or the process may continue immediately.

In FIG. 4(b), in oven 454 second layers of photoimagable dielectric 456,458 are laminated to each side of the structure 418 with heat and pressure using rolls 460,462 to form structure 464. After each lamination step in this process the substrate may be rolled and stored for later processing or the process may continue immediately. In station 470 lasers 472,474 pattern the second layers of photoimagable dielectric. In station 472 which is similar to station 430, the second layers of photoimagable dielectric are developed. In station 474 structure 464 is micro-etched and in station 476 the substrate structure is rinsed.

Figures 4C, 4D:
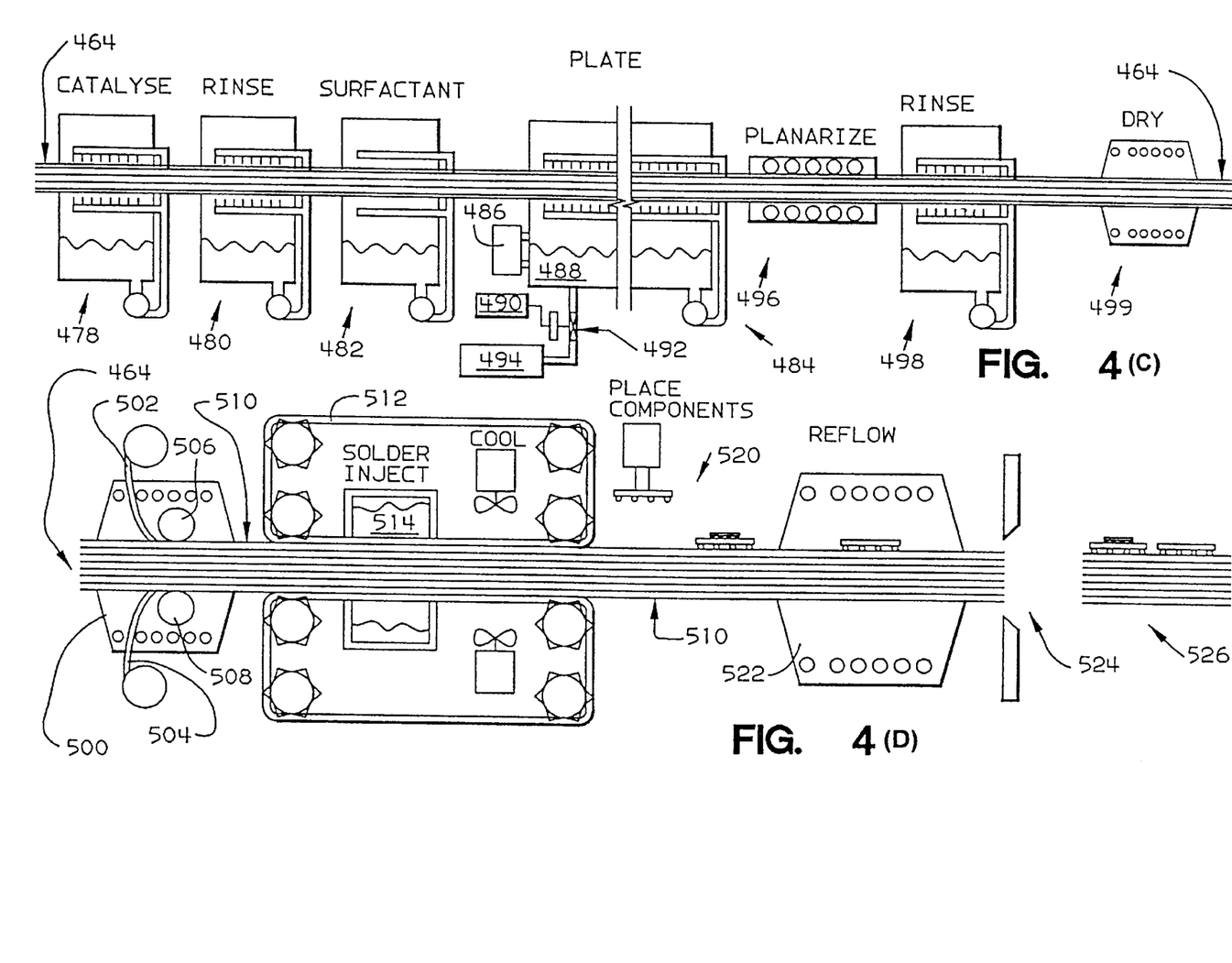

In FIG. 4(c), in station 478 the surface of the substrate is catalyzed and in station 480 the catalyzed surface is rinsed.

In station 482 solution with surfactant is deposited on the substrate and in station 484 copper is electrolessly plated on structure 464. In station 484 meter 486 determines the surface tension of plating solution 488 and transmits a value signal to computer system 490. The computer controls a valve 492 that regulates the flow of surfactant from source 494 into the plating solution. In station 496 the surface of the substrate structure is planerized to form an external wiring pattern and in station 498 the structure is rinsed, and in station 499 the structure is dried. Again, at this stage the substrate structure may be rolled up for later processing or processing may continue.

In FIG. 4(d), in oven 500 layers of solder resist 502,504 are laminated to each side of the structure 464 with heat and pressure using hot rolls 506,508 to form structure 510. Then mask 512 of a non solder wettable material is moved with the structure and solder 514 is injected into openings in the mask and onto the structure at pads for surface mount connection. The solder is cooled and the mask is separated from the structure. At station 520 components are placed on structure 510 with leads on solder on corresponding pads of the external wiring layer, and in oven 522 the solder is reflowed (heated to its liquidous temperature) to connect the components to the substrate. Finally in station 524 knives cut the substrate structure into individual circuit board assemblies or chip carrier assemblies 526.

Figure 5:
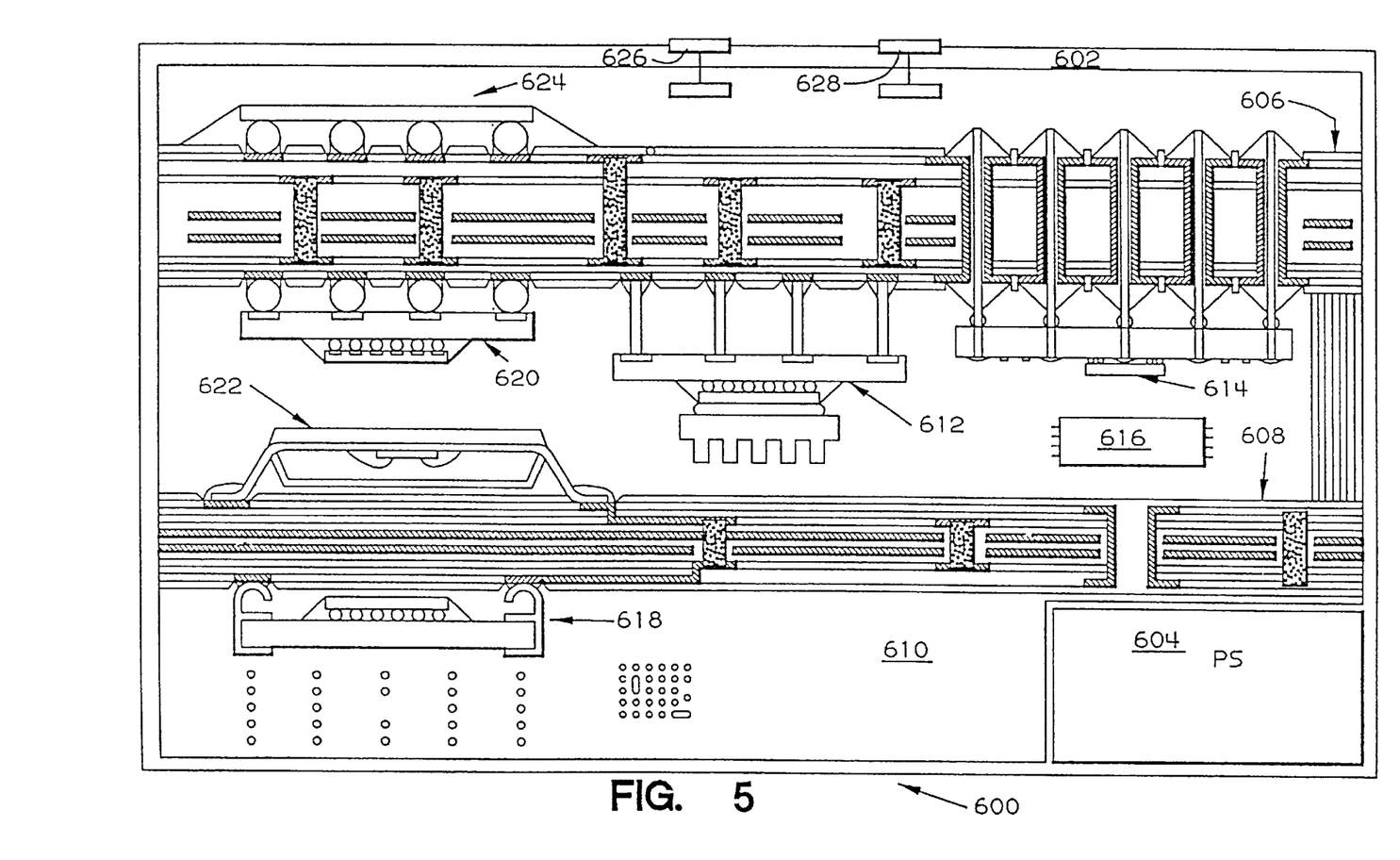
FIG. 5 schematically shows a computer system of the invention.

FIG. 5 illustrates computer system 600 of the invention with increased performance due to higher component densities and resulting shorter signal flight time. The system includes an enclosure 602 in which a power supply 604 and one or more circuit boards 606,608,610 are mounted. The circuit boards communicate through interconnect bus 612. The circuit boards include multiple components including direct connect flip chips pin grid array module 614, thin small outline package 616, ceramic J-lead component 618, ball grid array module 620, quad flat pack 622, flip chip 624, column grid array module 626. The components one or more CPUs, dynamic RAMs, static RAMs, and I/O processors connected to ports 626, 628 for communication with computer peripherals such as keyboards, mice, displays, printers, modems, networks.

Although the invention has been described specifically in terms of preferred embodiments, such embodiments are provided only as examples. Those skilled in the art are expected to make numerous changes and substitutions, including those discussed above, in arriving at their own embodiments, without departing from the spirit of the present invention. Thus, the scope of the invention is only limited by the following claims.

We claim:

1. A process for producing apparatus with metalized surfaces, comprising:
   producing apparatus with surfaces;
   exposing the surfaces to a first solution including surfactant;
   exposing the surfaces having residual surfactant from the first solution thereon, to a second solution including ions of an electroconductive metal, wherein the surfaces are exposed to the first solution immediately prior to exposing the surfaces to the second solution; and
   plating the electroconductive metal onto the surfaces while exposed to the second solution.

2. A process for producing circuitized substrates, comprising:
   producing substrates;
   applying a surfactant to the substrates; and circuitizing the substrates including:
  exposing the substrate, having a layer of residual surfactant thereon, to a plating solution, wherein the surfactant is applied to the substrate immediately prior to exposing the substrate to the plating solution; and
  plating electroconductive metal onto at least a portion of the substrate while exposed to the plating solution.

3. A process for producing circuitized substrates, comprising:
  producing substrates including forming sheets of polymer material filled with reinforcing material, wherein said polymer material includes epoxy, the reinforcing material includes axially rigid fibers, the axially rigid fibers include fiberglass, and producing substrates includes forming holes through the substrate;
  applying a surfactant to the substrates; and circuitizing the substrates including:
  exposing the substrate, having a layer of residual surfactant thereon, to a plating solution; and
  plating electroconductive metal onto at least a portion of the substrate while exposed to the plating solution.

4. A process for producing circuit board assemblies, comprising:
  providing electronic components;
  producing circuit board substrates;
  applying surfactant to the circuit board substrates;
  circuitizing the circuit board substrates to form a surface wiring layer with connection pads, including:
    exposing the substrate, having a layer of residual surfactant thereon, to a plating bath, wherein the surfactant is applied to the substrate immediately prior to exposing the substrate to the plating bath; and
    plating electroconductive metal onto the substrate while the substrate is exposed to the plating bath; and
  attaching the components to the substrates with component terminals connected to the connection pads to form a circuit boards.

5. A process for producing circuit board assemblies, comprising:
  providing electronic components, wherein:
    the electronic components include ball grid array components with an area array of connector terminals;
    the electronic components include flip chips with an area array of connector terminals on the face of the chip;
    the electronic components include wire bond chips with terminal wire bond pads in one or more rows along the periphery of the faces of the chips;
    the electronic components include leaded components with peripheral rows of lead terminals spaced center to center at about 0.4 mm or less;
  producing circuit board substrates;
  applying surfactant to the circuit board substrates;
  circuitizing the circuit board substrates to form a surface wiring layer with connection pads, wherein:
    circuitizing the circuit board substrates includes plating the through holes with electroconductive metal;
    circuitizing the circuit board substrates includes forming elongate conductors about 2 mils or less wide on surfaces of the circuit board substrates; and
    circuitizing the circuit board substrates includes forming connection pads for electrical connection with terminals of the components; and
  further wherein said circuitizing includes:
    exposing the substrate, having a layer of residual surfactant thereon, to a plating bath; and
    plating electroconductive metal onto the substrate while exposed to the plating bath; and
  attaching the components to the substrates with component terminals connected to the connection pads to form a circuit boards.

6. A process for producing organic chip carriers, comprising:
  forming an organic panel;
  applying a surfactant to the panel;
  circuitizing the panels including forming multiple arrays of connection pads for chip attachment, including:
    exposing the panel, having a layer of residual surfactant thereon, to a plating solution, wherein the surfactant is applied to the panel immediately prior to exposing the panel to the plating solution; and
    plating electroconductive metal onto the panel;
  slicing the panel into a multitude of individual chip carrier substrates; and
  forming terminals on the chip carrier substrates to produce chip carriers.

7. A process for producing organic chip carriers, comprising:
  forming an organic panel;
  applying a surfactant to the panel;
  circuitizing the panels including forming multiple arrays of connection pads for chip attachment, including:
    exposing the panel, having a layer of residual surfactant thereon, to a plating solution; and
    plating electroconductive metal onto the panel;
    forming multiple arrays of connection pads includes forming area arrays of connection pads spaced center to center about 10 mils or less, and about 6 mil or less in size, for connection of flip chips;
    forming multiple arrays of connection pads includes forming rows of wire bond connection pads spaced center to center about 10 mils or less, and about 6 mils or less in size, for connection of flips chips; and
  slicing the panel into a multitude of individual chip carrier substrates, including sawing to form a plurality of elongate strips and then sawing the strips into multiple individual chip carrier substrates; and
  forming terminals on the chip carrier substrates to produce chip carriers.

8. A process for producing apparatus with metalized surfaces, comprising:
  producing apparatus with surfaces;
  determining the surface tension of a solution including a surfactant and metal ions of an electroconductive metal for plating the metal onto the surfaces;
  metering surfactant into the solution depending on the determined surface tension; and
  exposing the surfaces to the solution and plating at least a portion of the surfaces with the electroconductive metal.

9. The process of claim 8 in which;
  determining the surface tension includes determining a value for the surface tension;
  metering depending on the surface tension includes:
    automatically determining a value related to the surface tension; and
    automatically regulating the addition of surfactant into the second solution depending on the determined value to regulate the level of surfactant in the second solution;

the surface tension is maintained at a level of about 50 dynes/cm or less;

the surface tension is maintained at a level of about 40 dynes/cm or less;

the surface tension is automatically measured by a Tensilometer;

the addition of surfactant is regulated by controlling a motor driving a metering pump;

the addition of surfactant is regulated by controlling the opening of a value positioned between a metering pump and a bath containing the second solution; and the process further comprises programming an information handling system with a CPU and RAM to transmit signals to control the addition of surfactant to the second solution depending on signals received from means for measuring the surface tension.

10. A method of operating a system for regulating the chemistry of a solution, comprising:

inputting a set point value into the system;

receiving signals defining a value related to the surface tension of the solution;

comparing the signaled value with the set point value; and transmitting signals for increasing or decreasing the rate of adding surfactant to the solution depending on the comparison.

11. The method of claim 10 in which:

the transmitted signals include signals for controlling the operation of a motor of a pump for pumping surfactant into a bath; and the transmitted signals include signals for controlling the position of a valve motor for controlling the flow of surfactant into a bath.

12. A method for electrolessly depositing metal onto a substrate, comprising:

exposing a surface of the substrate to a first solution including a surfactant; and exposing the surface, having residual surfactant from the first solution thereon, to a second solution including ions of an electroconductive metal element for plating the surface with the electroconductive metal while exposed to the second solution;

wherein the surface is exposed to the first solution immediately prior to exposing the surface to the second solution.

13. The method of claim 12, further comprising applying a catalyzing agent for electroless metal plating onto the substrate.

14. The method of claim 12, further comprising rinsing the substrate in a solvent.

15. The method of claim 12, wherein exposing the surface includes determining a surface tension of the second solution and regulating a level of the surfactant in the second solution depending on the surface tension.

16. The method of claim 15, wherein the regulating includes microprocessor control.

17. The method of claim 15, wherein the substrate includes holes therein.

18. A method for producing metalized surfaces on a substrate, comprising:

applying a first solution including a surfactant to the substrate; and applying a second solution including electroconductive ions to the substrate, wherein the substrate includes residual surfactant from the first solution thereon, and wherein the first solution is applied to the substrate immediately prior to applying the second solution to the substrate.

19. The method of claim 18, further comprising applying a catalyzing agent for electroless metal plating onto the substrate.

20. The method of claim 18, further comprising rinsing the substrate in a solvent.

21. The method of claim 18, further including determining a surface tension of the second solution and regulating a level of the surfactant in the second solution depending on the surface tension.

22. The method of claim 21, wherein the regulating includes microprocessor control.

23. The method of claim 18, wherein applying a first solution includes providing a bath containing the first solution.

24. The method of claim 18, wherein applying the second solution includes providing a bath containing the second solution and regulating a level of the surfactant in the bath containing the second solution.

25. The method of claim 18, wherein the substrate is a photo resist-developed film laminate.

26. The method of claim 18, wherein the substrate is a polymer.

27. The method of claim 18, wherein the substrate includes holes therein.

28. A method for producing fine line circuitized substrates, comprising:

applying a first solution including a surfactant to the substrate;

applying a second solution including electroconductive ions to the substrate;

determining a surface tension of the second solution; and controlling an amount of surfactant added to the second solution based on the surface tension.

29. The method of claim 28, further comprising applying a catalyzing agent for electroless metal plating onto the substrate.

30. The method of claim 28, further comprising rinsing the substrate in a solvent.

31. The method of claim 28, wherein controlling the amount of surfactant includes microprocessor control.

32. A method for producing metalized surfaces on a substrate, comprising:

applying a first solution including a surfactant to the substrate; and applying a second solution including electroconductive ions to the substrate, wherein the substrate includes residual surfactant from the first solution thereon, and wherein applying the second solution includes providing a bath containing the second solution and regulating a level of the surfactant in the bath containing the second solution.

33. The method of claim 32, further including determining a surface tension of the second solution.

* * * * *